United States Patent
Sakanishi

(10) Patent No.: US 10,844,334 B2
(45) Date of Patent: Nov. 24, 2020

(54) COMPOSITION FOR REMOVING RESIST

(71) Applicant: DAICEL CORPORATION, Osaka-shi, Osaka (JP)

(72) Inventor: Yuichi Sakanishi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 159 days.

(21) Appl. No.: 15/866,830

(22) Filed: Jan. 10, 2018

(65) Prior Publication Data

US 2018/0195030 A1    Jul. 12, 2018

(30) Foreign Application Priority Data

Jan. 11, 2017  (JP) .................... 2017-002539

(51) Int. Cl.

| | | |
|---|---|---|
| C11D 1/72 | (2006.01) | |
| C11D 1/722 | (2006.01) | |
| C11D 3/43 | (2006.01) | |
| C11D 3/44 | (2006.01) | |
| C11D 11/00 | (2006.01) | |
| C11D 1/00 | (2006.01) | |
| G03F 7/42 | (2006.01) | |
| C11D 3/20 | (2006.01) | |
| C11D 7/26 | (2006.01) | |
| C11D 3/37 | (2006.01) | |
| H01L 21/311 | (2006.01) | |

(52) U.S. Cl.
CPC .......... *C11D 11/0047* (2013.01); *C11D 1/008* (2013.01); *C11D 1/72* (2013.01); *C11D 1/722* (2013.01); *C11D 3/2065* (2013.01); *C11D 3/2068* (2013.01); *C11D 3/3757* (2013.01); *C11D 3/3765* (2013.01); *C11D 3/43* (2013.01); *C11D 7/263* (2013.01); *G03F 7/425* (2013.01); *G03F 7/426* (2013.01); *H01L 21/31133* (2013.01)

(58) Field of Classification Search
CPC ......... C11D 1/72; C11D 1/722; C11D 3/2065; C11D 3/2068; C11D 3/3757; C11D 3/3765; C11D 3/43

USPC ........ 510/175, 176, 245, 254, 475, 505, 506
See application file for complete search history.

(56) References Cited

U.S. PATENT DOCUMENTS

| | | | | |
|---|---|---|---|---|
| 2013/0123411 A1* | 5/2013 | Quillen | .................... | C11D 7/34 524/377 |
| 2014/0212367 A1* | 7/2014 | Sakanishi | ................ | A61K 8/86 424/70.1 |
| 2016/0032227 A1* | 2/2016 | Mochida | ................ | C11D 3/373 510/175 |
| 2019/0249122 A1* | 8/2019 | Uchida | ............... | C11D 11/0047 |

FOREIGN PATENT DOCUMENTS

| | | | | |
|---|---|---|---|---|
| JP | 63-69563 A | 3/1988 | | |
| JP | 4-42523 A | 2/1992 | | |
| JP | 2004-217814 A | 8/2004 | | |
| WO | WO-2006104340 A1 * | 10/2006 | ............. | G03F 7/422 |
| WO | WO-2007058443 A1 * | 5/2007 | ............. | G03F 7/423 |

* cited by examiner

*Primary Examiner* — Gregory R Delcotto
(74) *Attorney, Agent, or Firm* — Birch, Stewart, Kolasch & Birch, LLP

(57) ABSTRACT

Problem to be Solved
To provide a composition that can efficiently remove a photoresist adhering to an edge portion and a back surface of a substrate, in a process of producing a mask which is used when the substrate is subjected to etching treatment to have an element, a circuit etc., formed thereon using the photoresist.
Solution
The composition for removing a resist of the present invention is a composition comprising a surfactant and a solvent, wherein the composition contains, as the surfactant, at least the following component (A).
Component (A): a polyglycerol derivative represented by the following formula (a):

$$R^aO\text{---}(C_3H_5O_2R^a)_n\text{---}R^a \quad (a)$$

wherein n represents the number of the repeating units, and is an integer of 2 to 60; and $R^a$ identically or differently represents a hydrogen atom, a $C_{1-18}$ hydrocarbon group or a $C_{2-24}$ acyl group, provided that at least two of the (n+2) number of $R^a$ are $C_{1-18}$ hydrocarbon groups and/or $C_{2-24}$ acyl groups.

26 Claims, No Drawings

COMPOSITION FOR REMOVING RESIST

TECHNICAL FIELD

The present invention relates to a composition that is used for removing a photoresist which adheres to the edge or the back surface of a substrate, in a process of producing a mask that is used when forming an element, a circuit and the like by subjecting the substrate to etching treatment using the photoresist. The present application claims the priority of Japanese Patent Application No. 2017-002539 filed in Japan on Jan. 11, 2017, the contents of which are incorporated herein by reference in their entirety.

BACKGROUND ART

In the manufacture of semiconductor devices (transistor, capacitor, memory, light-emitting element, solar cell and the like) and electronic equipment (various displays and the like), a photolithographic method including the following steps is used as a method for forming an element and a circuit on a substrate.

[1] A photoresist is applied onto the substrate to form a resist coating film.

[2] The resist coating film is irradiated with light through a photomask in which a pattern of the element or the circuit is drawn to have a circuit pattern printed thereon.

[3] The resist coating film is immersed in a developing solution and the resist coating film in a portion other than a pattern portion is removed.

[4] The resist coating film that has remained after developing is cured to form a mask.

[5] The substrate is etched using the obtained mask.

In the above described step [1], a spin coater is mainly used for application of the photoresist. However, when the photoresist is applied with the use of the spin coater, the photoresist rises on the edge portion of the substrate or wraps around even to the back surface in some cases. Then, it is preferable that the photoresist in the rising portion and/or the wrapped portion be removed before the step [2], from the viewpoint of suppressing the contamination of an exposure apparatus and the reduction in the yield due to exposure failure.

As for methods of removing the photoresist, there is known a method of spraying a solvent having high dissolvability for the photoresist onto the portion in the resist coating film, which is desired to be removed, and dissolving the photoresist to remove the photoresist from the substrate surface (For instance, Patent Literature 1). As for the above described solvent, Patent Literature 2 describes that methyl 3-methoxypropionate, methyl 3-ethoxypropionate or ethyl 3-ethoxypropionate is used.

However, because the evaporation rate of the above described solvent is low, the solvent tends to easily penetrate into the portion of the resist coating film, which should not be removed, and it has been a problem that such a phenomenon thereby occurs that the interface of the coating film erodes and flows out (=tailing phenomenon). In the case of spraying the solvent while rotating the substrate at high speed, the occurrence of the tailing phenomenon tends to be suppressed by the action of the centrifugal force, but it has been a problem particularly in the case in which the rotation speed is slow and the action of the centrifugal force is hard to occur.

CITATION LIST

Patent Literature

Patent Literature 1
  Japanese Patent Laid-Open No. 63-69563
Patent Literature 2
  Japanese Patent Laid-Open No. 4-42523

SUMMARY OF INVENTION

Technical Problem

Accordingly, an object of the present invention is to provide a composition that can efficiently remove a photoresist adhering to an edge portion and a back surface of a substrate, in a process of producing a mask which is used when the substrate is subjected to etching treatment to have an element, a circuit and the like formed thereon using the photoresist.

Another object of the present invention is to provide a composition that can efficiently remove a photoresist adhering to an edge portion and a back surface of a substrate, while suppressing the occurrence of a tailing phenomenon, in a process of producing a mask which is used when the substrate is subjected to etching treatment to have an element, a circuit and the like formed thereon using the photoresist.

Solution to Problem

The present inventors made an extensive investigation in order to solve the above described problems, and as a result, found that the composition comprising the following component (A) can efficiently remove the photoresist. The present invention has been accomplished based on the findings.

Specifically, the present invention provides a composition for removing a resist, comprising a surfactant and a solvent, wherein the composition contains, as the surfactant, at least the following component (A):
Component (A): a polyglycerol derivative represented by the following formula (a)

$$R^aO\text{—}(C_3H_5O_2R^a)_n\text{—}R^a \qquad (a)$$

wherein a repeating unit shown in parentheses is represented by the following formulae (a-1) and/or (a-2):

[Formula 1]

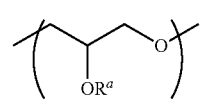
(a-1)

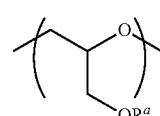
(a-2)

n represents the number of the repeating units, and is an integer of 2 to 60; and $R^a$ identically or differently represents a hydrogen atom, a hydrocarbon group having 1 to 18 carbon atoms, or an acyl group having 2 to 24 carbon atoms, provided that at least two of the (n+2) number of $R^a$ are hydrocarbon groups having 1 to 18 carbon atoms and/or acyl groups having 2 to 24 carbon atoms.

The present invention also provides the composition for removing a resist, wherein the composition contains, as the solvent, the following component (B):

Component (B): compound represented by the following formula (b)

wherein $R^b$ represents a hydrogen atom or a hydrocarbon group which may have a substituent; s represents 1 or 2, and t represents 0 or 1, and when s is 2, the group shown in the brackets may be the same or different.

The present invention also provides a composition for removing a resist, wherein the component (B) is at least one compound selected from the group consisting of propanol, propylene glycol, a propylene glycol monoalkyl ether, and a fatty acid ester of propylene glycol alkyl ether.

The present invention also provides the composition for removing a resist, wherein the propylene glycol monoalkyl ether is a propylene glycol mono $C_{1-5}$ alkyl ether, and the fatty acid ester of the propylene glycol alkyl ether is propylene glycol $C_{1-5}$ alkyl ether acetate.

The present invention also provides the composition for removing a resist, wherein the composition contains, as the solvent, the following component (C).

Component (C): alkyl acetate

The present invention also provides a composition for removing a resist, wherein the alkyl acetate in the component (C) is $C_{1-4}$ alkyl acetate.

The present invention also provides a composition for removing a resist, wherein a content of the component (A) is 1 to 15 parts by weight with respect to 100 parts by weight of the component (B) (or total of component (B) and component (C), when component (C) is contained).

The present invention also provides a composition for removing a resist, wherein the total content of the component (B) and the component (C) is not less than 60 wt % of the total amount of the composition for removing a resist, and a ratio of the content of the component (B) to the content of the component (C) (former/latter; weight ratio) is 5/95 to 80/20.

The present invention also provides the composition for removing a resist, wherein the composition further contains, as the surfactant, the following component (D).

Component (D): fluorinated acrylic copolymer

The present invention also provides a composition for removing a resist, wherein a content of the component (D) is 0.001 to 1 part by weight with respect to 100 parts by weight of the component (B) (or total of component (B) and component (C), when component (C) is contained).

The present invention also provides a composition for removing a resist, wherein a weight average molecular weight (in terms of polystyrene by GPC) of the fluorinated acrylic copolymer in the component (D) is 3000 to 10000.

The present invention also provides a composition for removing a resist, wherein the fluorinated acrylic copolymer in the component (D) is a polymer having at least one repeating unit represented by the following formula (d-1) and at least one repeating unit represented by the following formula (d-2):

[Formula 2]

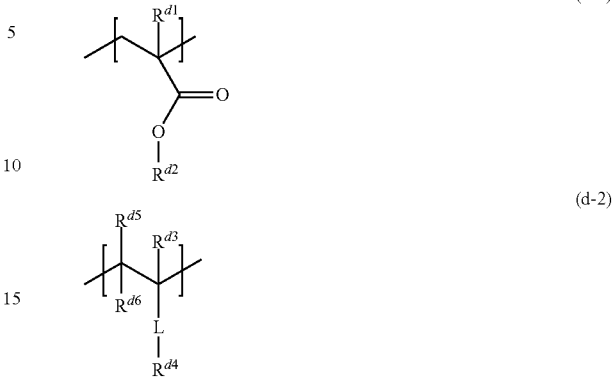

wherein $R^{d1}$ represents a hydrogen atom or a methyl group, and $R^{d2}$ represents an alkyl group having 1 to 20 carbon atoms; L represents a single bond or a linking group, and $R^{d3}$ represents a hydrogen atom, a methyl group or a fluorine atom; $R^{d4}$ represents a fluorine atom or a group in which at least one of hydrogen atoms in an alkyl group having 1 to 20 carbon atoms is replaced by a fluorine atom and $R^{d5}$ represents a hydrogen atom or a fluorine atom, and $R^{d6}$ represents a hydrogen atom or a halogen atom.

The composition for removing a resist of the present invention contains the above component (A), and accordingly has a high dissolving power for the photoresist. In addition, the composition for removing a resist has also an effect of preventing reattachment of a dissolved photoresist. Because of this, the composition can exhibit an excellent cleaning force.

In addition, in the case where the composition for removing a resist contains the component (B) as the solvent, because the component (B) has a high evaporation rate, the composition can suppress the penetration of the composition into the portion of the resist coating film, which should not be removed, even if the action of the centrifugal force is small at the time when spraying the above composition, or even if there is no action of the centrifugal force, and can efficiently remove the photoresist while suppressing the occurrence of the tailing phenomenon.

In addition, when the composition for removing a resist of the present invention is used, the composition can suppress a reduction in the yield in the manufacture of semiconductor devices or electronic equipment, and can dramatically improve the productivity.

DESCRIPTION OF EMBODIMENTS

[Composition for Removing Resist]

The composition for removing a resist of the present invention is a composition that is used in the application for removing a photoresist adhering to an edge portion and a back surface of a substrate, in a process of producing a mask which is used when a substrate is subjected to etching treatment to have an element, a circuit and the like formed thereon using the photoresist, the composition comprising a surfactant and a solvent, wherein the composition contains, as the surfactant, at least the following component (A).

Component (A): polyglycerol derivative represented by formula (a)

It is preferable that the composition for removing a resist of the present invention contains, as the solvent, the following component (B):
Component (B): compound represented by the following formula (b)

$$(H)_{2-s}—(C_3H_6)—[O(CO)_tR^b]_s \quad (b)$$

wherein $R^b$ represents a hydrogen atom or a hydrocarbon group which may have a substituent; s represents 1 or 2, and t represents 0 or 1, and when s is 2, the group shown in the brackets may be the same or different.

It is preferable that the composition for removing a resist of the present invention also contains, as the solvent, the following component (C).
Component (C): alkyl acetate It is preferable that the composition for removing a resist of the present invention further contains, as the surfactant, the following component (D).
Component (D): fluorinated acrylic copolymer
(Component (A))

The polyglycerol derivative of the component (A) is represented by the following formula (a):

$$R^aO—(C_3H_5O_2R^a)_n—R^a \quad (a)$$

wherein the repeating unit shown in the parentheses is represented by the following formulae (a-1) and/or (a-2):

[Formula 3]

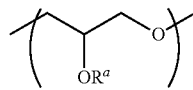
(a-1)

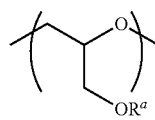
(a-2)

n represents the number of the above described repeating units, and is an integer of 2 to 60; and $R^a$ identically or differently represents a hydrogen atom, a hydrocarbon group having 1 to 18 carbon atoms, or an acyl group having 2 to 24 carbon atoms, provided that at least two of the (n+2) number of $R^a$ are hydrocarbon groups having 1 to 18 carbon atoms and/or acyl groups having 2 to 24 carbon atoms.

When the repeating unit shown in the parentheses has both of the repeating unit represented by the formula (a-1) and the repeating unit represented by the formula (a-2), there is no particular limitation in the bonding method of these repeating units, and any bonding method is acceptable, for instance, such as block bonding, random bonding, alternate bonding and graft bonding.

Examples of the hydrocarbon group in $R^a$ include an alkyl group having 1 to 18 carbon atoms, an alkenyl group having 2 to 18 carbon atoms, an alkapolyenyl group having 2 to 18 carbon atoms, an alicyclic hydrocarbon group having 3 to 18 carbon atoms, an aromatic hydrocarbon group having 6 to 18 carbon atoms, and a group formed by two or more of these groups, which have linked.

Examples of the above described alkyl group having 1 to 18 carbon atoms include linear or branched alkyl groups such as methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (n-lauryl), isododecyl, n-hexyldecyl, 2-hexyldecyl, tetradecyl, myristyl, isomyristyl, cetyl, isocetyl, stearyl and isostearyl groups. Among those, a linear or branched alkyl group having 8 to 18 carbon atoms is preferable.

Examples of the above described alkenyl group having 2 to 18 carbon atoms include linear or branched alkenyl groups such as vinyl, allyl, 2-butenyl, propenyl, hexenyl, 2-ethylhexenyl and oleyl groups.

Examples of the above described alkapolyenyl group having 2 to 18 carbon atoms include: alkadienyl groups such as butadienyl, pentadienyl, hexadienyl, heptadienyl, octadienyl, linoleyl and linolyl groups; alkatrienyl groups such as 1,2,3-pentatrienyl; and alkatetraenyl groups.

Examples of the above described alicyclic hydrocarbon group having 3 to 18 carbon atoms include saturated or unsaturated alicyclic hydrocarbon groups such as cyclobutyl, cyclopentyl, cyclohexyl, cyclooctyl, cyclododecyl, 2-cycloheptenyl and 2-cyclohexenyl groups (in particular, cycloalkyl groups and cycloalkenyl groups).

Examples of the above described aromatic hydrocarbon group having 6 to 18 carbon atoms include a phenyl group and a naphthyl group.

Examples of the group in which two or more of the above described groups are linked include benzyl, 2-phenylethenyl, 1-cyclopentylethyl, 1-cyclohexylethyl, cyclohexylmethyl, 2-cyclohexylethyl, and 1-cyclohexyl-1-methylethyl groups.

The above described acyl group having 2 to 24 carbon atoms includes an aliphatic acyl group and an aromatic acyl group, and examples of the aliphatic acyl group include saturated or unsaturated aliphatic acyl groups such as acetyl, propionyl, butyryl, isobutyryl, stearoyl and oleoyl groups. Examples of the aromatic acyl group include benzoyl, toluoyl and naphthoyl groups.

Among those, examples of compounds preferable as $R^a$ include a hydrogen atom, a linear or branched alkyl group (among them, branched alkyl group having 8 to 18 carbon atoms, in particular, branched alkyl group having 8 to 15 carbon atoms), or an aliphatic acyl group (in particular, saturated aliphatic acyl group having 10 to 18 carbon atoms).

In formula (a), n represents the number of repeating units (degree of polymerization) shown in the above described parentheses. The value of n is an integer of 2 to 60, and the lower limit of the value of n is preferably 5, more preferably is 10, particularly preferably is 15, and most preferably is 18. The upper limit of the value of n is preferably 50, particularly preferably is 40, most preferably is 30, and especially preferably is 25. The polyglycerol derivative wherein the value of n is in the above described range has excellent solubility in the component (B) and the component (C), and the composition for removing a resist, which contains the polyglycerol derivative, tends to have an affinity to the photoresist, and can exhibit an excellent dissolving power. On the other hand, the polyglycerol derivative in which the value of n is out of the above described range has too low hydrophilicity or lipophilicity, and thereby it becomes difficult to dissolve in the component (B) and the component (C). Accordingly, the composition for removing a resist, which contains the polyglycerol derivative, tends to lower the dissolving power for the photoresist.

The weight average molecular weight of the above described polyglycerol derivative is, for instance, 200 to 20000, preferably is 600 to 15000, more preferably is 1000 to 10000, particularly preferably is 1500 to 5000, and most preferably is 2000 to 4500. The polyglycerol derivative having the weight average molecular weight in the above described range is particularly excellent in a surface-active function, and tends to further improve the dissolving power for the photoresist, which is accordingly preferable. In addition, in the present specification, the weight average molecular weight is a molecular weight in terms of the standard polystyrene which is measured by gel permeation chromatography (GPC).

The above described polyglycerol derivative is expressed by the above described formula (a), wherein at least two of the (n+2) number of $R^a$ in the formula (a) are hydrocarbon groups having 1 to 18 carbon atoms and/or acyl groups having 2 to 24 carbon atoms.

In the present invention, in particular, a compound is preferable in which, for instance, 25 to 95% (preferably 30 to 90%, and particularly preferably 40 to 90%) in the (n+2) number of $R^a$ are a hydrocarbon group having 1 to 18 carbon atoms and/or an acyl group having 2 to 24 carbon atoms; and in further particular, at least one compound is preferable that is selected from the group consisting of compounds in which 25 to 95% (preferably 30 to 90%, and particularly preferably 40 to 90%) in the (n+2) number of $R^a$ in the formula (a) are a hydrocarbon group having 1 to 18 carbon atoms, and 25 to 60% (preferably 30 to 55%, and particularly preferably 40 to 55%) in the (n+2) number of $R^a$ in the formula (a) are an acyl group having 2 to 24 carbon atoms.

The above described polyglycerol derivative can be produced with the use of various methods. The method for producing the polyglycerol derivative will be illustrated below, but the above described polyglycerol derivative is not limited to the polyglycerol derivative produced by the following methods.

(1) A method for adding a glycidyl ether derivative (for instance, compound represented by the following formula: $R^a$ is the same as the above description) to glycerol or polyglycerol.

[Formula 4]

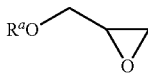

(2) A method for condensing an alkyl halide (for instance, $R^{a1}X$: X represents a halogen atom. $R^{a1}$ represents hydrocarbon group having 1 to 18 carbon atoms), a carboxylic acid (for instance, $R^{a2}OH$: $R^{a2}$ represents acyl group having 2 to 24 carbon atoms), or a derivative thereof (for instance, carboxylic acid halide, acid anhydride or the like), with polyglycerol.

In the above described method (1), it is preferable that the addition reaction is carried out in the presence of an alkaline catalyst. Examples of the alkaline catalyst include sodium hydroxide, potassium hydroxide, lithium hydroxide, metallic sodium and sodium hydride. These compounds can be used singly or in combination with other one or more types.

Examples of polyglycerol in the above described methods (1) and (2), which can be suitably used, include commercial products such as trade name "PGL03P" (poly(3)glycerol), "PGL06" (poly(6)glycerol), "PGL10PSW" (poly(10)glycerol), "PGL20PW" (poly(20)glycerol), "PGLXPW" (poly(40)glycerol) (which are all made by Daicel Corporation).

The above described polyglycerol derivative is a compound having a surface-active function. The composition for removing a resist of the present invention contains the above polyglycerol derivative. Because the above polyglycerol derivative exhibits the function of lowering an interfacial tension with the photoresist, the composition for removing a resist of the present invention tends to have an affinity to the photoresist, and can exhibit an excellent dissolving power for the photoresist. Because of having an effect of preventing the reattachment of the dissolved resist, the composition for removing a resist of the present invention can efficiently remove the photoresist.

(Component (B))

The component (B) is a compound represented by the following formula (b). The above compound is excellent in the dissolving power for the photoresist. It is preferable that the composition for removing a resist of the present invention contains one or two or more types of components (B), from the viewpoint that the composition can exhibit a particularly excellent dissolving power for the photoresist.

wherein $R^b$ represents a hydrogen atom or a hydrocarbon group which may have a substituent; s represents 1 or 2, and t represents 0 or 1, and when s is 2, the group shown in the brackets may be the same or different.

The hydrocarbon group in $R^b$ includes an aliphatic hydrocarbon group, an alicyclic hydrocarbon group, an aromatic hydrocarbon group, and a group in which two or more of the above groups are bonded to each other.

An aliphatic hydrocarbon group having 1 to 20 carbon atoms is preferable as the above described aliphatic hydrocarbon group, and the examples thereof include: alkyl groups having 1 to 20 (preferably 1 to 10 and particularly preferably 1 to 3) carbon atoms such as methyl, ethyl, propyl, isopropyl, butyl, isobutyl, s-butyl, t-butyl, pentyl, hexyl, decyl and dodecyl groups; alkenyl groups having 2 to 20 (preferably 2 to 10 and particularly preferably 2 to 3) carbon atoms such as vinyl, allyl and 1-butenyl groups; and alkynyl groups having approximately 2 to 20 (preferably 2 to 10 and particularly preferably 2 to 3) carbon atoms such as ethynyl and propynyl group.

The above described alicyclic hydrocarbon group is preferably a 3 to 20 membered alicyclic hydrocarbon group, and the examples include 3 to 20 membered (preferably 3 to 15 membered and particularly preferably 5 to 8 membered) cycloalkyl groups such as cyclopropyl, cyclobutyl, cyclopentyl, cyclohexyl and cyclooctyl groups.

Examples of the above described aromatic hydrocarbon group include aryl groups having 6 to 14 carbon atoms such as a phenyl group.

Examples of the group in which two or more of the above described groups are linked include aralkyl groups having 7 to 15 carbon atoms such as a benzyl group.

Examples of the substituent which the above described hydrocarbon group may have include a hydroxyl group, and a substituted oxy group (for instance, $C_{1-10}$ alkoxy group, $C_{6-14}$ aryloxy group, $C_{7-15}$ aralkyloxy group, $C_{1-10}$ acyloxy group and the like).

The alkyl group in $R^b$ is preferably an alkyl group having 1 to 20 carbon atoms (for instance, linear or branched alkyl group), and particularly preferably is an alkyl group having 1 to 5 carbon atoms.

The ($C_3H_6$) group shown in parentheses in the above described formula (b) may be any of a trimethylene group ($-CH_2CH_2CH_2-$) and a propylene group ($-CH(CH_3)CH_2-$).

Examples of the compound represented by the above formula (b) include propanol, an ether compound of propanol, an ester compound of propanol, propylene glycol, a propylene glycol monoalkyl ether, a propylene glycol dialkyl ether, a propylene glycol mono fatty acid ester, a propylene glycol difatty acid ester, and a fatty acid ester of a propylene glycol alkyl ether.

Examples of the above described propanol include 1-propanol and 2-propanol.

Examples of the above described ether compound of the propanol include dipropyl ether, diisopropyl ether, methyl propyl ether, methyl isopropyl ether, ethyl propyl ether, ethyl isopropyl ether, benzyl isopropyl ether, ethylene glycol isopropyl ether, ethylene glycol propyl ether, and dipropylene glycol monopropyl ether.

Examples of the above described ester compound of propanol include propyl acetate and isopropyl acetate.

Examples of the above described propylene glycol include 1,2-propylene glycol and 1,3-propylene glycol.

Preferable examples of the compounds represented by the above described formula (b) are at least one compound among the above compounds, which is selected from the group consisting of propanol, propylene glycol, propylene glycol monoalkyl ether, and fatty acid esters of propylene glycol alkyl ether, and it is preferable in particular that the compound contains at least the fatty acid ester of propylene glycol alkyl ether, in the point of being particularly excellent in the dissolving power for the photoresist.

Preferable examples of the above described propylene glycol monoalkyl ethers are propylene glycol mono $C_{1-5}$ alkyl ethers such as propylene glycol monomethyl ether, propylene glycol n-propyl ether and propylene glycol n-butyl ether.

Preferable examples of the above described fatty acid esters of the propylene glycol alkyl ether are propylene glycol $C_{1-5}$ alkyl ether acetate (=acetic acid ester of propylene glycol $C_{1-5}$ alkyl ether) such as propylene glycol methyl ether acetate, propylene glycol ethyl ether acetate, propylene glycol n-propyl ether acetate, propylene glycol isopropyl ether acetate, propylene glycol n-butyl ether acetate, propylene glycol isobutyl ether acetate, and propylene glycol t-butyl ether acetate.

It is preferable that the boiling point (under atmospheric pressure) of the component (B) is, for instance, not higher than 250° C. (for instance, 120 to 250° C.), from the viewpoint of providing an effect of suppressing the occurrence of the tailing phenomenon, particularly preferably is not higher than 200° C., and most preferably is not higher than 160° C.

The viscosity (at 25° C. at shear rate of 20 (1/s)) of the component (B) is, for instance, not larger than 50 cps (for instance, 0.1 to 50 cps), preferably is not larger than 30 cps, particularly preferably is not larger than 10 cps, and most preferably is not larger than 5 cps. When the viscosity is within the above described range, the application properties are excellent. Incidentally, the viscosity can be measured with the use of a rheometer (trade name "Physica MCR 301", made by Anton Paar Gmbh).

The surface tension (at 20° C.) of the component (B) is, for instance, not larger than 50 dyn/cm² (for instance, 10 to 50 dyn/cm²), preferably is not larger than 30 dyn/cm², and particularly preferably is not larger than 28 dyn/cm². When the surface tension is in the above described range, the component (B) tends to have the affinity to the photoresist, and can quickly dissolve and remove the photoresist. Incidentally, the surface tension is measured with the Wilhelmy method.

(Component (C))

The alkyl acetate of the component (C) is slightly inferior to the above described component (B) (in particular, component (B) containing at least fatty acid ester of propylene glycol alkyl ether), in dissolvability for the photoresist, but has a fast evaporation rate. Thus, it is preferable for the composition for removing a resist of the present invention to contain the component (C) as the solvent, and is particularly preferable to use the above described component (B) and component (C) in combination, in the point that the composition can exhibit an excellent dissolving power for the photoresist, and further suppress the occurrence of the tailing phenomenon. The alkyl acetates can be used singly alone or in combination with other one or more types.

The above described alkyl acetate is represented, for instance, by the following formula (c).

$$CH_3COO\text{—}R^{c1} \qquad (c)$$

In the formula (c), $R^{c1}$ represents an alkyl group, preferably an alkyl group having 1 to 20 carbon atoms (for instance, linear or branched alkyl group), and particularly preferably is an alkyl group having 1 to 4 carbon atoms. In other words, $C_{1-4}$ alkyl acetate is preferable as the alkyl acetate.

Preferable examples of the above described alkyl acetates include methyl acetate, ethyl acetate, n-propyl acetate, isopropyl acetate, n-butyl acetate, isobutyl acetate and t-butyl acetate. Among them, at least one type selected from the group consisting of n-propyl acetate, isopropyl acetate, n-butyl acetate, isobutyl acetate and t-butyl acetate is preferable, in the point of having relatively low viscosity and a high evaporation rate.

The boiling point (under atmospheric pressure) of the above described alkyl acetate is preferably, for instance, not higher than 250° C. (for instance, 110 to 250° C.), more preferably is not higher than 200° C., further preferably is not higher than 160° C., particularly preferably is not higher than 145° C., most preferably is not higher than 140° C., and especially preferably is not higher than 135° C., from the viewpoint of being excellent in an effect of suppressing the occurrence of the tailing phenomenon.

The viscosity (at 25° C., and at shear rate of 20 (1/s)) of the above described alkyl acetate is, for instance, not larger than 50 cps (for instance, 0.01 to 50 cps), preferably is not larger than 30 cps or less, more preferably is not larger than 10 cps, particularly preferably is not larger than 5 cps, most preferably is not larger than 1 cps, and especially preferably is not larger than 0.5 cps. When the viscosity is within the above described range, the application properties are excellent.

The flash point (by closed cup method) of the above described alkyl acetate is, for instance, not lower than 5° C., preferably is not lower than 10° C., particularly preferably is not lower than 15° C., and most preferably is not lower than 20° C. When having a flash point lower than the above described range, the alkyl acetate is not preferable because there is a problem in safety.

The surface tension (at 20° C.) of the above described alkyl acetate is, for instance, not larger than 50 dyn/cm² (for instance, 10 to 50 dyn/cm²), preferably is not larger than 30 dyn/cm², and particularly preferably is not larger than 28 dyn/cm². When the surface tension is in the above described range, the composition tends to have the affinity to the photoresist, and can quickly dissolve and remove the photoresist.

In the present invention, it is particularly preferable to use butyl acetate (boiling point: 126.1° C., flash point: 23° C., viscosity: 0.74 cps, and surface tension: 25 dyn/cm²). The butyl acetate has a low surface tension and has an excellent dissolving power for the photoresist; and accordingly by a small amount of the butyl acetate being contained in the composition for removing a resist, can dramatically improve the effect of removing the photoresist. In addition, the butyl acetate has a high evaporation rate, and accordingly has also an effect of suppressing the occurrence of the tailing phenomenon. In addition, the butyl acetate has low toxicity (50% lethal dose (LD 50) by mouse oral administration: 7.0 g/kg); and is easily hydrolyzed, and has a low environmental load.

(Component (D))

The fluorinated acrylic copolymer of the component (D) is a compound having a surface-active function. The composition for removing a resist of the present invention can contain one or two or more fluorinated acrylic copolymers.

When the composition for removing a resist of the present invention contains a fluorinated acrylic copolymer as a surfactant, together with the above described component (A), the composition can further lower the interfacial tension with the photoresist, and can further improve the affinity to the photoresist. Thus, even if the content, for instance, of the component (B) (in particular, component (B) containing at least fatty acid ester of propylene glycol alkyl ether) is reduced, the composition becomes enabled to keep the excellent dissolving power for the photoresist, and by reducing the content of the above described component (B), can further suppress the occurrence of the tailing phenomenon.

More specifically, when the composition for removing a resist of the present invention containing the fluorinated acrylic copolymer contains the component (B) (in particular, component (B) containing at least fatty acid ester of propylene glycol alkyl ether) and further contains the component (C), the composition can reduce a ratio of the above described component (B) to the total content of the above described component (B) and component (C), and increase a ratio of the component (C). The above described component (B) has a slower evaporation rate than the component (C), and accordingly reducing a ratio of the above described component (B) and increasing the ratio of the component (C), can increase the evaporation rate of the composition for removing a resist and can further suppress the occurrence of the tailing phenomenon.

Accordingly, when the composition for removing a resist of the present invention contains the fluorinated acrylic copolymer, the composition can further suppress the occurrence of the tailing phenomenon while keeping the excellent dissolving power for the photoresist.

Examples of the fluorinated acrylic copolymer include a polymer that has at least one repeating unit represented by the following formula (d-1) and at least one repeating unit represented by the following formula (d-2):

[Formula 5]

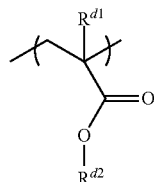

(d-1)

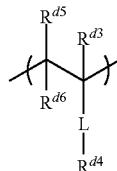

(d-2)

wherein $R^{d1}$ represents a hydrogen atom or a methyl group, and $R^{d2}$ represents an alkyl group having 1 to 20 carbon atoms; L represents a single bond or a linking group, and $R^{d3}$ represents a hydrogen atom, a methyl group or a fluorine atom; $R^{d4}$ represents a fluorine atom or a group in which at least one of hydrogen atoms in an alkyl group having 1 to 20 carbon atoms is replaced by a fluorine atom; and $R^{d5}$ represents a hydrogen atom or a fluorine atom, and $R^{d6}$ represents a hydrogen atom or a halogen atom.

Among alkyl groups having 1 to 20 carbon atoms in the above described $R^{d2}$, alkyl groups having 1 to 10 carbon atoms (particularly preferably, 1 to 5 carbon atoms) are preferable such as an ethyl group (for instance, linear or branched alkyl group).

Preferable examples of the group in which at least one hydrogen atom in the alkyl group having 1 to 20 carbon atoms in the above described $R^{d4}$ is replaced by a fluorine atom include 2-(perfluoro $C_{5-15}$ alkyl) ethyl groups such as a 2-(tridecafluorohexyl)ethyl group.

The above described $R^{d4}$ may have another substituent (for instance, alkoxysilyl group and the like), in addition to the fluorine atom.

The halogen atom in the above described $R^{d6}$ includes a fluorine atom, a chlorine atom, a bromine atom and an iodine atom.

Examples of the linking group in the above described L include a carbonyl group (—CO—), an ether bond (—O—), an ester bond (—COO—), a carbonate group (—O—CO—O—), an amide group (—CONH—), and groups in which a plurality of the groups are linked.

It is preferable that the weight average molecular weight (in terms of standard polystyrene by GPC) of the above described fluorinated acrylic copolymer is, for instance, 3000 to 10000, in the point of the solubility in the component (B) and the component (C).

Among the above described fluorinated acrylic copolymers, the polymer having at least one repeating unit represented by the above described formula (d-1) and at least one repeating unit represented by the above described formula (d-2) can be produced, for instance, by the copolymerization of at least one monomer represented by the following formula (d-1-1) and at least one monomer represented by the following formula (d-2-1). Incidentally, $R^{d1}$ to $R^{d6}$ and L in the following formula are the same as the above description.

[Formula 6]

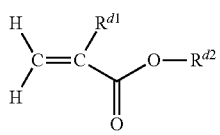

(d-1-1)

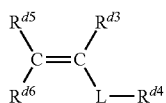

(d-2-1)

The above described fluorinated acrylic copolymer may be a copolymer of the above described monomer, and may be any one of a block copolymer, a graft copolymer and a random copolymer.

Suitably usable examples of the above described fluorinated acrylic copolymer include a commercial product such as "Megaface R-08" (trade name, made by Dainippon Ink & Chemicals, Inc.).

(Composition for Removing Resist)

The composition for removing a resist of the present invention is a composition comprising a surfactant and a solvent, wherein the composition contains, as the surfactant, at least the following component (A).

In addition, it is preferable that the composition for removing a resist of the present invention contains the component (B) and/or component (C) as the solvent, and it is particularly preferable to contain the component (C), together with the component (B) (in particular, component (B) containing at least fatty acid ester of propylene glycol alkyl ether).

Furthermore, it is preferable that the composition for removing a resist of the present invention contains component (D) as the surfactant, in addition to the above described component (A).

The content of the component (B) is, for instance, 10 to 90 wt % of the total amount of the composition for removing a resist, preferably is 10 to 70 wt %, particularly preferably is 10 to 55 wt %, most preferably is 10 to 40 wt %, and especially preferably is 10 to 30 wt %, from the viewpoint of being capable of increasing the evaporation rate, and further suppressing the occurrence of the tailing phenomenon even though the action of a centrifugal force is small or there is no action of the centrifugal force when the composition for removing a resist of the present invention is applied.

The content of the component (C) is, for instance, 5 to 80 wt % of the total amount of the composition for removing a resist, preferably is 30 to 80 wt %, particularly preferably is 40 to 80 wt %, most preferably is 50 to 80 wt %, and especially preferably is 60 to 80 wt %, from the viewpoint of being capable of further suppressing the occurrence of the tailing phenomenon, even though the action of a centrifugal force is small or there is no action of the centrifugal force when the composition for removing a resist of the present invention is applied.

The total content of the component (B) (in particular, component (B) containing at least fatty acid ester of propylene glycol alkyl ether) and the component (C) is, for instance, not less than 60 wt % (60 to 99 wt %) of the total amount of the composition for removing a resist, preferably is 70 to 99 wt %, particularly preferably is 75 to 98 wt %, and most preferably is 80 to 97 wt %.

A ratio of the content of the component (B) (in particular, component (B) containing at least fatty acid ester of propylene glycol alkyl ether) to the content of the component (C) (former/latter; weight ratio) is, for instance, 5/95 to 80/20, preferably is 5/95 to 75/25, particularly preferably is 10/90 to 30/70, and most preferably is 10/90 to 25/75.

The content of the component (A) is, for instance, 1 to 70 wt % of the total amount of the composition for removing a resist, preferably is 1 to 30 wt %, particularly preferably is 1 to 20 wt %, most preferably is 1 to 10 wt %, and especially preferably is 3 to 10 wt %.

The content of the component (A) is, for instance, 1 to 15 parts by weight with respect to 100 parts by weight of the component (B) (or total of component (B) and component (C), when component (C) is contained), preferably is 1 to 10 parts by weight, and particularly preferably is 2 to 8 parts by weight, from the viewpoint of being capable of further suppressing the occurrence of the tailing phenomenon, even though the action of a centrifugal force is small or there is no action of the centrifugal force when the composition for removing a resist of the present invention is applied.

The content of the component (D) is, for instance, 0.001 to 1 wt % of the total amount of the composition for removing a resist, preferably is 0.005 to 0.1 wt %, and particularly preferably is 0.005 to 0.05 wt %.

In addition, the content of the component (D) is, for instance, 0.001 to 1 part by weight with respect to 100 parts by weight of the component (B) (or total of component (B) and component (C), when component (C) is contained), preferably is 0.005 to 0.1 parts by weight, and particularly preferably is 0.005 to 0.05 parts by weight.

The composition for removing a resist of the present invention can contain one or two or more types of other components, in addition to the above described component (A), component (B), component (C) and component (D), in such a range as not to impair the effect of the present invention. For instance, the composition for removing a resist of the present invention can have a solvent other than the above described component (B) and component (C), and/or a compound (for instance, polyethylene-oxide-based condensate) having a surface-active function other than the above described component (A) and component (D).

Particularly when the composition for removing a resist of the present invention contains the component (B) (in particular, component (B) containing at least fatty acid ester of propylene glycol alkyl ether) as the solvent, it is preferable that the composition also contains ketone as another solvent [for instance, methyl ethyl ketone, methyl isobutyl ketone, cyclopentanone, cyclohexanone and cycloheptanone, and in particular, cyclic ketone such as cyclohexanone] having a boiling point (under normal pressure), for instance, not higher than 160° C. (for instance, 130 to 160° C.), from the viewpoint of being capable of further suppressing the occurrence of the tailing phenomenon.

The content of the above described ketone (cyclic ketone in particular) is, for instance, not more than 20 wt % (for instance, 1 to 20 wt %) of the total amount of the composition for removing a resist, and preferably is not more than 15 wt % (for instance, 5 to 15 wt %).

The total content of the component (B) (in particular, component (B) containing at least fatty acid ester of propylene glycol alkyl ether) and the above described ketone (cyclic ketone in particular) in the total amount of the composition for removing a resist of the present invention is, for instance, 10 to 90 wt %, preferably is 10 to 70 wt %, particularly preferably is 10 to 55 wt %, most preferably is 10 to 40 wt %, and especially preferably is 10 to 30 wt %.

The total content of the component (B) (in particular, component (B) containing at least fatty acid ester of propylene glycol alkyl ether), the component (C), and the above described ketone (cyclic ketone in particular) in the total amount of the composition for removing a resist of the present invention is, for instance, not less than 80 wt %, preferably is not less than 85 wt %, and particularly preferably is not less than 90 wt %. The upper limit of the total content is, for instance, 99 wt %, and preferably is 97 wt %.

In the total amount of the composition for removing a resist of the present invention, a ratio of the total content of the component (B) (in particular, component (B) containing at least fatty acid ester of propylene glycol alkyl ether) and the above described ketone (cyclic ketone in particular) to the content of the component (C) [(above described component (B)+above described ketone)/component (C); weight ratio] is, for instance, 5/95 to 80/20, preferably is 5/95 to 75/25, particularly preferably is 10/90 to 30/70, and most preferably is 10/90 to 25/75.

In the total amount of the composition for removing a resist of the present invention, the total content of the component (A), the component (B), the component (C), the component (D) and the above described ketone (cyclic ketone in particular) is, for instance, not less than 80 wt %, preferably is not less than 85 wt %, particularly preferably is not less than 90 wt %, and most preferably is not less than 95 wt %. Incidentally, the upper limit of the total content is 100 wt %.

The composition for removing a resist of the present invention can be prepared by an operation of mixing the above described component (A), component (B), component (C) and, as needed, other components [for instance, component (D), above described ketone (cyclic ketone in particular) and/or the like].

The viscosity (at 25° C. and shear rate of 20 (1/s)) of the composition for removing a resist of the present invention is, for instance, not larger than 50 cps, preferably is not larger than 30 cps, and particularly preferably is not larger than 28 cps.

As for a method of using the composition for removing a resist of the present invention, for instance, there is a method of applying a photoresist onto a substrate with the use of an applicator, and then applying the composition for removing a resist of the present invention to an unnecessary photoresist adhering to the end and the back surface of the substrate to dissolve the above described photoresist; and thereby the composition can remove the unnecessary photoresist. Incidentally, the photoresist includes a positive type resist or a negative type resist for the g-line, the i-line, the KrF excimer laser or the ArF excimer laser.

It is preferable that the amount of the composition for removing a resist of the present invention to be applied is appropriately adjusted according to the type and the film thickness of the photoresist to be used. In the case in which the composition for removing a resist is supplied by dropping or spraying, the supply rate is preferably in a range of 5 to 100 mL/min, for instance.

EXAMPLES

The present invention will be described more specifically below with reference to Examples, but the present invention is not limited to the Examples.

Preparation Example 1 (Preparation of Polyglycerol Derivative (A-1))

Into a reaction vessel, 90 parts by weight of glycerol and 1 part by weight of an aqueous solution of 48 wt % NaOH of an alkaline catalyst were charged, then into the resultant solution, 3540 parts by weight (amount corresponding to 19 mol with respect to 1 mol of glycerol) of 2-ethylhexyl glycidyl ether were added dropwise for 12 hours while the temperature in the reaction vessel was kept at 100° C., and then the resultant solution was aged for 1 hour. After that, an aqueous solution of 85 wt % phosphoric acid was added to the aged solution to have stopped the reaction, and a polyglycerol derivative (A-1) was obtained.

Preparation Example 2 (Preparation of Polyglycerol Derivative (A-2))

A polyglycerol derivative (A-2) was obtained in a similar way to that in Preparation Example 1, except that decaglycerol was used instead of the glycerol, and the amount of the 2-ethylhexyl glycidyl ether to be used was changed to an amount corresponding to 10 mol with respect to 1 mol of the decaglycerol.

Preparation Example 3 (Preparation of Polyglycerol Derivative (A-3))

Into the reaction vessel, 1500 parts by weight of poly(20) glycerol, 2000 parts by weight of lauric acid (amount corresponding to 10 mol with respect to 1 mol of poly(20) glycerol) and 1 part by weight of an aqueous solution of 48 wt % sodium hydroxide were charged, the temperature in the reaction vessel was raised to 200° C. at normal pressure under a stream of nitrogen, and the reaction was continued for 10 hours. After the reaction was finished, the reaction vessel was cooled until the internal temperature of the reaction vessel reached room temperature, and a polyglycerol derivative (A-3) was obtained.

Preparation Example 4 (Preparation of Polyglycerol Derivative (A-4))

A polyglycerol derivative (A-4) was obtained in a similar way to that in Preparation Example 3, except that isostearic acid was used instead of lauric acid.

Preparation Example 5 (Preparation of Test Piece)

A silicon oxide substrate was used of which the diameter was 8 inches.

The above substrate was immersed in a tank containing hydrogen peroxide and a tank containing sulfuric acid each for 5 minutes to have been cleaned, and then was rinsed with ultrapure water. After that, the substrate was dried with the use of a rotary dryer (product made by VERTEQ, Model SRD 1800-6).

A photoresist was spin-coated onto the substrate which was already cleaned and dried, with the use of a rotary coating applicator (Model EBR TRACK made by Koryo Semiconductor Co., Ltd.).

Specifically, 10 mL of the following photoresist was dropped onto the center of the stationary substrate, and then the photoresist was spread with the use of the rotary coating applicator which was rotated at 500 rpm for 3 seconds. Next, the rotation speed was accelerated to approximately 2000 to 4000 rpm, the applicator was rotated for 20 to 30 seconds, and the thickness of the film was adjusted to the following description; and a test piece (=substrate having resist coating film thereon) was obtained.
(Photoresist)
  G-line positive type resist: trade name "DTFR-2000" made by Dongjin Semichem Co., Ltd. and coating film thickness of 1.5 μm
  G-line negative type resist: trade name "DNR-H100 PL" and coating film thickness of 4 μm
  PI for organic EL: photocurable polyimide, trade name "DL-1003" and coating thickness of 1.5 μm Examples 1 to 15 and Comparative Examples 1 to 10

Each component described in the following Table 1 was mixed according to the prescription (unit: part by weight), and the compositions for removing a resist were prepared.

TABLE 1

|  | Component (A) | Component (B) | | | Component (C) | Component (D) | Other |
|---|---|---|---|---|---|---|---|
|  |  | PGMEA | MMPG | IPA | n-BE | R-08 | CXN |
| Example 1 | A-1(5.0) |  |  | 95 |  |  |  |
| Example 2 | A-1(5.0) |  | 95 |  |  |  |  |
| Example 3 | A-1(5.0) | 28.5 | 66.5 |  |  |  |  |
| Example 4 | A-1(5.0) | 60 |  |  | 35 |  |  |
| Example 5 | A-2(5.0) | 60 |  |  | 35 |  |  |
| Example 6 | A-3(5.0) | 60 |  |  | 35 |  |  |
| Example 7 | A-4(5.0) | 60 |  |  | 35 |  |  |
| Example 8 | A-1(5.0) | 60 |  |  | 25 |  | 10 |
| Example 9 | A-1(5.0) | 20 |  |  | 75 |  |  |
| Example 10 | A-1(5.0) | 10 |  |  | 75 |  | 10 |
| Example 11 | A-2(5.0) | 60 |  |  | 25 |  | 10 |
| Example 12 | A-3(5.0) | 20 |  |  | 75 | 0.01 |  |
| Example 13 | A-4(5.0) | 10 |  |  | 75 | 0.01 | 10 |
| Example 14 | A-1(5.0) | 60 |  |  | 35 |  |  |
| Example 15 | A-3(5.0) | 60 |  |  | 35 |  |  |
| Comparative Example 1 | PG-1(5.0) | 60 |  |  | 35 |  |  |
| Comparative Example 2 | PG-2(5.0) | 60 |  |  | 35 |  |  |
| Comparative Example 3 | PG-3(5.0) | 60 |  |  | 35 |  |  |
| Comparative Example 4 | PG-4(5.0) | 60 |  |  | 35 |  |  |
| Comparative Example 5 | PG 5(5.0) | 60 |  |  | 35 |  |  |
| Comparative Example 6 | PG-6(5.0) | 60 |  |  | 35 |  |  |
| Comparative Example 7 | POA-1(5.0) | 60 |  |  | 35 |  |  |
| Comparative Example 8 | POA-2(5.0) | 60 |  |  | 35 |  |  |
| Comparative Example 9 | POA-3(5.0) | 60 |  |  | 35 |  |  |
| Comparative Example 10 | POA-4(5.0) | 60 |  |  | 35 |  |  |

<Component (A)>

A-1: a compound was used that was obtained by the addition polymerization of 19 mol of 2-ethylhexyl glycidyl ether to 1 mol of glycerol, had a weight average molecular weight of 3800, and was produced in Preparation Example 1.

A-2: a compound was used that was obtained by the addition polymerization of 10 mol of 2-ethylhexyl glycidyl ether to 1 mol of decaglycerol, had a weight average molecular weight of 2700, and was produced in Preparation Example 2.

A-3: a compound was used that was obtained by the ester bonding of 10 mol of a lauric acid to 1 mol of poly(20)glycerol, had a weight average molecular weight of 3500, and was produced in Preparation Example 3.

A-4: a compound was used that was obtained by the ester bonding of 10 mol of an isostearic acid to 1 mol of poly(20)glycerol, had a weight average molecular weight of 4200, and was produced in Preparation Example 4.

PG-1: a compound that is obtained by the addition polymerization of 4 mol of 2,3-epoxy-1-propanol to 1 mol of lauryl alcohol, has a weight average molecular weight of 480, and is a trade name "PGLALML 04" made by Daicel Corporation PG-2: a compound that is obtained by the addition polymerization of 10 mol of 2,3-epoxy-1-propanol to 1 mol of lauryl alcohol, and has a weight average molecular weight of 927

PG-3: a compound that is obtained by the addition polymerization of 6 mol of 2,3-epoxy-1-propanol to 1 mol of lauryl alcohol, and has a weight average molecular weight of 630

PG-4: a compound that is obtained by the addition polymerization of 10 mol of 2,3-epoxy-1-propanol to 1 mol of isostearyl alcohol, and has a weight average molecular weight of 1020

PG-5: a compound that is obtained by the addition polymerization of 9 mol of 2,3-epoxy-1-propanol to 1 mol of glycerol, has a weight average molecular weight of 760, and is a trade name "PGL10PS" made by Daicel Corporation PG-6: a compound that is obtained by the addition polymerization of 19 mol of 2,3-epoxy-1-propanol to 1 mol of glycerol, has a weight average molecular weight of 1500, and is a trade name "PGL20P" made by Daicel Corporation POA-1: a compound that was obtained by the addition polymerization of 48 mol of ethylene oxide to 1 mol of ethylene glycerol and then the addition polymerization of 38 mol of propylene oxide to the resultant compound, and had a weight average molecular weight of 4400

POA-2: a compound that was obtained by the addition polymerization of 32 mol of ethylene oxide to 1 mol of ethylene glycerol, and then the addition polymerization of 20 mol of propylene oxide to the resultant compound, and had a weight average molecular weight of 2600

POA-3: a compound that is obtained by the addition polymerization of 10 mol of ethylene oxide to 1 mol of lauryl alcohol, has a weight average molecular weight of 630, and is a trade name "EMALEX 710" made by Nihon Emulsion Co., Ltd.

a pressurized vessel equipped with a pressure gauge, the applied pressure at this time was 1.0 kgf, and the flow rate of the composition for removing a resist was set at between 10 and 20 mL/min. The results are shown in the following table.

TABLE 2

| Photoresist | EBR condition | Example | | | | | | | | | | | | | | | Comparative Example | | | | | | | | | |
|---|---|---|---|---|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 1 | 2 | 3 | 4 | 5 | 6 | 7 | 8 | 9 | 10 |
| g-line positive type resist | 400 rpm 7 sec | ○ | ⊙ | ○ | ⊙ | ○ | △ | ⊙ | ○ | ○ | △ | ○ | ⊙ | △ | ⊙ | ○ | △ | △ | X | X | △ | X | △ | X | X | △ |
| | 500 rpm 7 sec | ○ | ⊙ | ○ | ⊙ | ○ | ○ | ⊙ | ○ | ○ | ○ | ○ | ○ | ○ | ⊙ | ○ | △ | △ | △ | △ | △ | △ | △ | △ | △ | △ |
| | 500 rpm 10 sec | ⊙ | ⊙ | ⊙ | ⊙ | ○ | ⊙ | ⊙ | ⊙ | ⊙ | ○ | ⊙ | ⊙ | ⊙ | ⊙ | ○ | ○ | ○ | △ | △ | △ | ○ | △ | ○ | △ | △ |
| g-line negative type resist | 400 rpm 7 sec | ○ | ⊙ | ○ | ⊙ | △ | ○ | ⊙ | ○ | ○ | ○ | ○ | ⊙ | ○ | ⊙ | ○ | △ | △ | △ | X | X | X | X | △ | X | X | △ |
| | 500 rpm 7 sec | ⊙ | ⊙ | ⊙ | ⊙ | ○ | ⊙ | ⊙ | ⊙ | ○ | ○ | ⊙ | ⊙ | ⊙ | ⊙ | ○ | △ | △ | X | △ | △ | △ | △ | △ | X | △ |
| | 500 rpm 10 sec | ⊙ | ⊙ | ⊙ | ⊙ | ⊙ | ⊙ | ⊙ | ⊙ | ⊙ | ⊙ | ⊙ | ⊙ | ⊙ | ⊙ | ○ | △ | ○ | △ | ○ | △ | △ | ○ | ○ | △ | △ |
| PI for organic EL | 400 rpm 7 sec | ⊙ | ⊙ | ○ | ⊙ | ○ | △ | ⊙ | ○ | ○ | ○ | ○ | ⊙ | ○ | ⊙ | ○ | △ | △ | X | X | △ | X | △ | X | X | X |
| | 500 rpm 7 sec | ⊙ | ⊙ | ⊙ | ⊙ | ○ | ⊙ | ⊙ | ⊙ | ○ | ○ | ⊙ | ⊙ | ⊙ | ⊙ | ○ | △ | △ | △ | △ | X | △ | △ | △ | △ | △ |
| | 500 rpm 10 sec | ⊙ | ⊙ | ⊙ | ⊙ | ⊙ | ○ | ⊙ | ○ | ○ | ○ | ⊙ | ⊙ | ⊙ | ⊙ | ⊙ | ○ | ○ | △ | ○ | △ | △ | △ | △ | △ | △ |

Evaluation criteria
⊙: No tailing phenomenon occurred, and the whole end face of the resist coating film was sharp.
○: Portions not less than 80% and less than 100% of the whole end face of the resist coating film were sharp.
△: Portions not less than 50% but less than 80% of the whole end face of the resist coating film were sharp.
X: The sharp portions of the whole end face of the resist coating film were less than 50%.

POA-4: a compound that is obtained by the addition polymerization of 20 mol of ethylene oxide to 1 mol of lauryl alcohol, has a weight average molecular weight of 1100, and is a trade name "EMALEX 720" made by Nihon Emulsion Co., Ltd.

<Component (B)>
PGMEA: propylene glycol methyl ether acetate, boiling point: 146° C., viscosity (at 25° C. and shear rate of 20 (1/s)): 1.1 cps, and surface tension: 26.7 dyn/cm$^2$ MMPG: propylene glycol monomethyl ether, boiling point: 121° C., viscosity (at 25° C. and shear rate of 20 (1/s)): 1.7 cps, and surface tension: 27.7 dyn/cm$^2$ IPA: 2-propanol, boiling point: 82.4° C., viscosity (at 25° C. and shear rate 20 (1/s)): 2.0 cps, and surface tension: 20.8 dyn/cm$^2$ <Component (C)>
n-BE: butyl acetate, boiling point: 126.1° C., flash point: 23° C., viscosity (at 25° C. and shear rate 20 (1/s)): 0.74 cps, and surface tension: 25 dyn/cm$^2$ <Component (D)>
R-08: fluorinated acrylic copolymer, trade name "Megaface R-08" made by Dainippon Ink & Chemicals, Inc.

<Others>
CXN: cyclohexanone, boiling point: 155.65° C., viscosity (at 25° C. and shear rate 20 (1/s)): 2.017 cps, and surface tension: 35.2 dyn/cm$^2$ <Evaluation of Photoresist Removability>
An experiment (edge bead Removing experiment: hereinafter occasionally referred to as "EBR experiment") for removing an unnecessary photoresist on the edge portion was conducted with the use of the test piece obtained in Preparation Example 5. Also in the EBR experiment, the above described rotary applicator was used.

Specifically, in a state in which the test piece obtained in Preparation Example 5 was rotated at a speed shown in the following table, each of the compositions for removing a resist obtained in Examples and Comparative Examples was sprayed through an EBR nozzle in the time period (7 seconds or 10 seconds) shown in the following table. Each of the compositions for removing a resist was supplied from As shown in Table 2, the composition for removing a resist obtained in the Examples could efficiently remove the photoresist in the edge portion while suppressing the occurrence of the tailing phenomenon, even when the rotation speed of the test piece was slow (in other words, even when action of centrifugal force is small).

On the other hand, the compositions for removing a resist obtained in Comparative Examples were inferior in the effect of suppressing the occurrence of the tailing phenomenon. In particular, when the rotation speed of the test piece was slow, the composition for removing a resist could not suppress the occurrence of the tailing phenomenon. This becomes a factor of lowering the manufacture of a semiconductor device, electronic equipment and the like.

The configuration of the present invention and variations thereof may be summarized as follows.

[1] A composition for removing a resist, comprising a surfactant and a solvent, wherein the composition contains, as the surfactant, at least the following component (A):

Component (A): a polyglycerol derivative represented by the following formula (a)

$$R^a O-(C_3H_5O_2R^a)_n-R^a \qquad (a)$$

wherein a repeating unit shown in parentheses is represented by the following formulae (a-1) and/or (a-2):

[Formula 7]

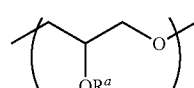
(a-1)

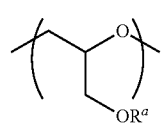
(a-2)

n represents the number of the repeating units, and is an integer of 2 to 60; and $R^a$ identically or differently represents a hydrogen atom, a hydrocarbon group having 1 to 18 carbon atoms, or an acyl group having 2 to 24 carbon atoms, provided that at least two of the (n+2) number of $R^a$ are hydrocarbon groups having 1 to 18 carbon atoms and/or acyl groups having 2 to 24 carbon atoms.

[2] The composition for removing a resist according to [1], wherein the composition contains, as the solvent, the following component (B):

Component (B): compound represented by the following formula (b)

wherein $R^b$ represents a hydrogen atom or a hydrocarbon group which may have a substituent; s represents 1 or 2, and t represents 0 or 1, and when s is 2, the group shown in the brackets may be the same or different.

[3] The composition for removing a resist according to [2], wherein the component (B) is at least one compound selected from the group consisting of propanol, propylene glycol, a propylene glycol monoalkyl ether, and a fatty acid ester of a propylene glycol alkyl ether.

[4] The composition for removing a resist according to [3], wherein the propylene glycol monoalkyl ether is a propylene glycol mono $C_{1-5}$ alkyl ether, and the fatty acid ester of the propylene glycol alkyl ether is propylene glycol $C_{1-5}$ alkyl ether acetate.

[5] The composition for removing a resist according to any one of [1] to [4], wherein the composition contains, as the solvent, the following component (C):

Component (C): alkyl acetate.

[6] The composition for removing a resist according to [5], wherein the alkyl acetate in the component (C) is $C_{1-4}$ alkyl acetate.

[7] The composition for removing a resist according to any one of [2] to [6], wherein a content of the component (A) is 1 to 15 parts by weight with respect to 100 parts by weight of the component (B) (or total of component (B) and component (C), when component (C) is contained).

[8] The composition for removing a resist according to any one of [5] to [7], wherein the total content of the component (B) and the component (C) is not less than 60 wt % of a total amount of the composition for removing a resist, and a ratio of the content of the component (B) to the content of the component (C) (former/latter; weight ratio) is 5/95 to 80/20.

[9] The composition for removing a resist according to any one of [1] to [8], wherein the composition further contains, as the surfactant, the following component (D):

Component (D): fluorinated acrylic copolymer.

[10] The composition for removing a resist according to [9], wherein a content of the component (D) is 0.001 to 1 part by weight with respect to 100 parts by weight of the component (B) (or total of component (B) and component (C), when component (C) is contained).

[11] The composition for removing a resist according to [9] or [10], wherein a weight average molecular weight (in terms of polystyrene by GPC) of the fluorinated acrylic copolymer in the component (D) is 3000 to 10000.

[12] The composition for removing a resist according to any one of [9] to [11], wherein the fluorinated acrylic copolymer in the component (D) is a polymer having at least one repeating unit represented by the following formula (d-1) and at least one repeating unit represented by the following formula (d-2):

[Formula 8]

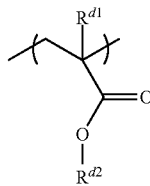

(d-1)

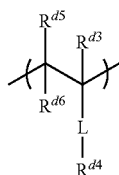

(d-2)

wherein $R^{d1}$ represents a hydrogen atom or a methyl group, and $R^{d2}$ represents an alkyl group having 1 to 20 carbon atoms; L represents a single bond or a linking group, and $R^{d3}$ represents a hydrogen atom, a methyl group or a fluorine atom; $R^{d4}$ represents a fluorine atom or a group in which at least one of hydrogen atoms in an alkyl group having 1 to 20 carbon atoms is replaced by a fluorine atom; and $R^{d5}$ represents a hydrogen atom or a fluorine atom, and $R^{d6}$ represents a hydrogen atom or a halogen atom.

[13] The composition for removing a resist according to any one of [1] to [12], wherein the hydrocarbon group in $R^a$ include an alkyl group having 1 to 18 carbon atoms, an alkenyl group having 2 to 18 carbon atoms, an alkapolyenyl group having 2 to 18 carbon atoms, an alicyclic hydrocarbon group having 3 to 18 carbon atoms, an aromatic hydrocarbon group having 6 to 18 carbon atoms, and a group formed by two or more of these groups, which have linked, the alkyl group having 1 to 18 carbon atoms include methyl, ethyl, n-propyl, 2-methyl-1-propyl, n-butyl, t-butyl, 3,3-dimethyl-2-butyl, n-pentyl, isopentyl, t-amyl, n-hexyl, 2-ethylhexyl, n-octyl, isooctyl, n-decyl, 4-decyl, isodecyl, dodecyl (n-lauryl), isododecyl, n-hexyldecyl, 2-hexyldecyl, tetradecyl, myristyl, isomyristyl, cetyl, isocetyl, stearyl and isostearyl groups, the a alkenyl group having 2 to 18 carbon atoms include vinyl, allyl, 2-butenyl, propenyl, hexenyl, 2-ethylhexenyl and oleyl groups, the alkapolyenyl group having 2 to 18 carbon atoms include butadienyl, pentadienyl, hexadienyl, heptadienyl, octadienyl, linoleyl and linolyl groups; 1,2,3-pentatrienyl; and alkatetraenyl groups, the alicyclic hydrocarbon group having 3 to 18 carbon atoms include cyclobutyl, cyclopentyl, cyclohexyl, cyclooctyl, cyclododecyl, 2-cycloheptenyl and 2-cyclohexenyl groups, the aromatic hydrocarbon group having 6 to 18 carbon atoms include a phenyl group and a naphthyl group, the group in which two or more of the above described groups are linked include benzyl, 2-phenylethenyl, 1-cyclopentylethyl, 1-cyclohexylethyl, cyclohexylmethyl, 2-cyclohexylethyl, and 1-cyclohexyl-1-methylethyl groups, the acyl group having 2 to 24 carbon atoms includes acetyl, propionyl, butyryl, isobutyryl, stearoyl and oleoyl, benzoyl, toluoyl and naphthoyl groups.

[14] The composition for removing a resist according to any one of [1] to [13], wherein the value of n in formula (a) is an integer of 2 to 60, and the lower limit of the value of n is 5, 10, 15, or 18, and the upper limit of the value of n is 50, 40, 30, or 25.

[15] The composition for removing a resist according to any one of [1] to [14], wherein the weight average molecular weight of the polyglycerol derivative is 200 to 20000, 600 to 15000, 1000 to 10000, 1500 to 5000, or 2000 to 4500.

[16] The composition for removing a resist according to any one of [1] to [15], wherein 25 to 95%, 30 to 90%, or 40 to 90% in the (n+2) number of $R^a$ are a hydrocarbon group having 1 to 18 carbon atoms and/or an acyl group having 2 to 24 carbon atoms; and 25 to 95%, 30 to 90%, or 40 to 90% in the (n+2) number of $R^a$ in the formula (a) are a hydrocarbon group having 1 to 18 carbon atoms, and 25 to 60%, 30 to 55%, or 40 to 55% in the (n+2) number of $R^a$ in the formula (a) are an acyl group having 2 to 24 carbon atoms.

[17] The composition for removing a resist according to any one of [1] to [16], wherein the aliphatic hydrocarbon in $R^b$ include methyl, ethyl, propyl, isopropyl, butyl, isobutyl, s-butyl, t-butyl, pentyl, hexyl, decyl and dodecyl groups; vinyl, allyl and 1-butenyl groups; and ethynyl and propynyl group; cyclopropyl, cyclobutyl, cyclopentyl, cyclohexyl and cyclooctyl groups; phenyl group; and benzyl group.

[18] The composition for removing a resist according to any one of [1] to [17], wherein the compound represented by the above formula (b) include 1-propanol and 2-propanol; dipropyl ether, diisopropyl ether, methyl propyl ether, methyl isopropyl ether, ethyl propyl ether, ethyl isopropyl ether, benzyl isopropyl ether, ethylene glycol isopropyl ether, ethylene glycol propyl ether, and dipropylene glycol monopropyl ether; propyl acetate and isopropyl acetate; 1,2-propylene glycol and 1,3-propylene glycol; propylene glycol monomethyl ether, propylene glycol n-propyl ether and propylene glycol n-butyl ether; propylene glycol methyl ether acetate, propylene glycol ethyl ether acetate, propylene glycol n-propyl ether acetate, propylene glycol isopropyl ether acetate, propylene glycol n-butyl ether acetate, propylene glycol isobutyl ether acetate, and propylene glycol t-butyl ether acetate

[19] The composition for removing a resist according to any one of [1] to [18], wherein the alkyl acetates include methyl acetate, ethyl acetate, n-propyl acetate, isopropyl acetate, n-butyl acetate, isobutyl acetate and t-butyl acetate.

[20] The composition for removing a resist according to any one of [1] to [19], wherein the content of the component (B) is 10 to 90 wt %, 10 to 70 wt %, 10 to 55 wt %, 10 to 40 wt %, or 10 to 30 wt % of the total amount of the composition for removing a resist.

[21] The composition for removing a resist according to any one of [1] to [20], wherein the content of the component (C) is, 5 to 80 wt %, 30 to 80 wt %, 40 to 80 wt %, 50 to 80 wt %, or 60 to 80 wt % of the total amount of the composition for removing a resist.

[22] The composition for removing a resist according to any one of [1] to [21], wherein the total content of the component (B) and the component (C) is not less than 60 wt %, 60 to 99 wt %, 70 to 99 wt %, 75 to 98 wt %, or 80 to 97 wt % of the total amount of the composition for removing a resist.

[23] The composition for removing a resist according to any one of [1] to [22], wherein a ratio of the content of the component (B) to the content of the component (C) (former/latter; weight ratio) is 5/95 to 80/20, 5/95 to 75/25, 10/90 to 30/70, and 10/90 to 25/75.

[24] The composition for removing a resist according to any one of [1] to [23], wherein the content of the component (A) is 1 to 70 wt %, 1 to 30 wt %, 1 to 20 wt %, 1 to 10 wt %, or 3 to 10 wt % of the total amount of the composition for removing a resist.

[25] The composition for removing a resist according to any one of [1] to [24], wherein the content of the component (A) is 1 to 15 parts by weight, 1 to 10 parts by weight, or 2 to 8 parts by weight with respect to 100 parts by weight of the component (B) or total of component (B) and component (C).

[26] The composition for removing a resist according to any one of [1] to [25], wherein the content of the component (D) is 0.001 to 1 wt %, 0.005 to 0.1 wt %, or 0.005 to 0.05 wt % of the total amount of the composition for removing a resist.

[27] The composition for removing a resist according to any one of [1] to [26], wherein the content of the component (D) is 0.001 to 1 part by weight, 0.005 to 0.1 parts by weight, or 0.005 to 0.05 parts by weight with respect to 100 parts by weight of the component (B) or total of component (B) and component (C).

INDUSTRIAL APPLICABILITY

The present invention provides a composition that can efficiently remove a photoresist adhering to an edge portion and a back surface of a substrate, in a process of producing a mask which is used when the substrate is subjected to etching treatment to have an element, a circuit etc., formed thereon using the photoresist.

The invention claimed is:

1. A composition for removing a resist, comprising a surfactant and a solvent, wherein the composition contains, as the surfactant, at least the following component (A):

Component (A): a polyglycerol derivative represented by the following formula (a)

$$R^aO-(C_3H_5O_2R^a)_n-R^a \qquad (a)$$

wherein a repeating unit shown in parentheses is represented by the following formulae (a-1) and/or (a-2):

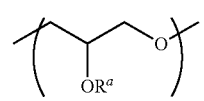

(a-1)

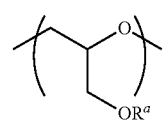

(a-2)

n represents the number of the repeating units, and is an integer of 2 to 60; and $R^a$ identically or differently represents a hydrogen atom, a hydrocarbon group having 1 to 18 carbon atoms, or an acyl group having 2 to 24 carbon atoms, provided that 25 to 95% in the (n+2) number of $R^a$ are hydrocarbon groups having 1 to 18 carbon atoms and/or acyl groups having 2 to 24 carbon atoms.

2. The composition for removing a resist according to claim 1, wherein the composition contains, as the solvent, the following component (B):

Component (B): compound represented by the following formula (b)

$$(H)_{2-s}-(C_3H_6)-[O(CO)_tR^b]_s \quad (b)$$

wherein $R^b$ represents a hydrogen atom or a hydrocarbon group which may have a substituent; s represents 1 or 2, and t represents 0 or 1, and when s is 2, the group shown in the brackets may be the same or different.

3. The composition for removing a resist according to claim 2, wherein the component (B) is at least one compound selected from the group consisting of propanol, propylene glycol, a propylene glycol monoalkyl ether, and a fatty acid ester of a propylene glycol alkyl ether.

4. The composition for removing a resist according to claim 3, wherein the propylene glycol monoalkyl ether is a propylene glycol mono $C_{1-5}$ alkyl ether, and the fatty acid ester of the propylene glycol alkyl ether is propylene glycol $C_{1-5}$ alkyl ether acetate.

5. The composition for removing a resist according to claim 1, wherein the composition contains, as the solvent, the following component (C):

Component (C): alkyl acetate.

6. The composition for removing a resist according to claim 5, wherein the alkyl acetate in the component (C) is $C_{1-4}$ alkyl acetate.

7. The composition for removing a resist according to claim 2, wherein a content of the component (A) is 1 to 15 parts by weight with respect to 100 parts by weight of the component (B).

8. The composition for removing a resist according to claim 5, wherein the total content of the component (B) and the component (C) is not less than 60 wt % of a total amount of the composition for removing a resist, and a ratio of the content of the component (B) to the content of the component (C), former/latter; weight ratio, is 5/95 to 80/20.

9. The composition for removing a resist according to claim 1, wherein the composition further contains, as the surfactant, the following component (D):

Component (D): fluorinated acrylic copolymer.

10. The composition for removing a resist according to claim 9, wherein a content of the component (D) is 0.001 to 1 part by weight with respect to 100 parts by weight of the component (B).

11. The composition for removing a resist according to claim 9, wherein a weight average molecular weight, in terms of polystyrene by GPC, of the fluorinated acrylic copolymer in the component (D) is 3000 to 10000.

12. The composition for removing a resist according to claim 9, wherein the fluorinated acrylic copolymer in the component (D) is a polymer having at least one repeating unit represented by the following formula (d-1) and at least one repeating unit represented by the following formula (d-2):

(d-1)

(d-2)

wherein $R^{d1}$ represents a hydrogen atom or a methyl group, and $R^{d2}$ represents an alkyl group having 1 to 20 carbon atoms; L represents a single bond or a linking group, and $R^{d3}$ represents a hydrogen atom, a methyl group or a fluorine atom; $R^{d4}$ represents a fluorine atom or a group in which at least one of hydrogen atoms in an alkyl group having 1 to 20 carbon atoms is replaced by a fluorine atom; and $R^{d5}$ represents a hydrogen atom or a fluorine atom, and $R^{d6}$ represents a hydrogen atom or a halogen atom.

13. The composition for removing a resist according to claim 2, wherein the composition contains, as the solvent, the following component (C):

Component (C): alkyl acetate.

14. The composition for removing a resist according to claim 3, wherein the composition contains, as the solvent, the following component (C):

Component (C): alkyl acetate.

15. The composition for removing a resist according to claim 4, wherein the composition contains, as the solvent, the following component (C):

Component (C): alkyl acetate.

16. The composition for removing a resist according to claim 3, wherein a content of the component (A) is 1 to 15 parts by weight with respect to 100 parts by weight of the component (B).

17. The composition for removing a resist according to claim 4, wherein a content of the component (A) is 1 to 15 parts by weight with respect to 100 parts by weight of the component (B).

18. The composition for removing a resist according to claim 5, wherein a content of the component (A) is 1 to 15 parts by weight with respect to 100 parts by weight of the component (B).

19. The composition for removing a resist according to claim 6, wherein a content of the component (A) is 1 to 15 parts by weight with respect to 100 parts by weight of the component (B).

20. The composition for removing a resist according to claim 6, wherein the total content of the component (B) and the component (C) is not less than 60 wt % of a total amount of the composition for removing a resist, and a ratio of the content of the component (B) to the content of the component (C), former/latter; weight ratio, is 5/95 to 80/20.

21. The composition for removing a resist according to claim 1,
wherein the composition contains the following component (B) and the following component (C) as the solvent;
wherein a content of the component (A) is 1 to 15 parts by weight with respect to 100 parts by the total weight of component (B) and component (C):
Component (B): compound represented by the following formula (b)

$$(H)_{2-s}-(C_3H_6)-[O(CO)_tR^b]_s \quad (b)$$

wherein $R^b$ represents a hydrogen atom or a hydrocarbon group which may have a substituent; s represents 1 or 2, and t represents 0 or 1, and when s is 2, the group shown in the brackets may be the same or different Component (C): alkyl acetate.

22. The composition for removing a resist according to claim 1,
wherein the composition contains, the following component (B) and the following component (C) as the solvent, and the following component (D) as the surfactant;
wherein a content of the component (D) is 0.001 to 1 part by weight with respect to 100 parts by the total weight of the component (B) and component (C): Component (B): compound represented by the following formula (b)

$$(H)_{2-s}-(C_3H_6)-[O(CO)_tR^b]_s \qquad (b)$$

wherein $R^b$ represents a hydrogen atom or a hydrocarbon group which may have a substituent; s represents 1 or 2, and t represents 0 or 1, and when s is 2, the group shown in the brackets may be the same or different Component (C): alkyl acetate Component (D): fluorinated acrylic copolymer.

23. The composition for removing a resist according to claim 1,
wherein $R^a$ in formula (a) represents a hydrogen atom, a branched alkyl group having 8 to 18 carbon atoms, or an aliphatic acyl group having 10 to 18 carbon atoms.

24. The composition for removing a resist according to claim 1,
wherein 'n' in formula (a) represents an integer of 10 to 30.

25. The composition for removing a resist according to claim 1, wherein the composition contains the following component (B) as the solvent;
wherein the boiling point of the component (B) under atmospheric pressure is 120 to 250° C.;

Component (B): compound represented by the following formula (b)

$$(H)_{2-s}-(C_3H_6)-[O(CO)_tR^b]_s \qquad (b)$$

wherein $R^b$ represents a hydrogen atom or a hydrocarbon group which may have a substituent; s represents 1 or 2, and t represents 0 or 1, and when s is 2, the group shown in the brackets may be the same or different.

26. The composition for removing a resist according to claim 1, wherein the composition contains the following component (B) as the solvent;
wherein the surface tension of the component (B) at 20° C. is 10 to 30 dyn/cm²;

Component (B): compound represented by the following formula (b)

$$(H)_{2-s}-(C_3H_6)-[O(CO)_tR^b]_s \qquad (b)$$

wherein $R^b$ represents a hydrogen atom or a hydrocarbon group which may have a substituent; s represents 1 or 2, and t represents 0 or 1, and when s is 2, the group shown in the brackets may be the same or different.

* * * * *